(12) United States Patent
Li et al.

(10) Patent No.: US 10,552,989 B2
(45) Date of Patent: Feb. 4, 2020

(54) POINT CLOUD ATTRIBUTE COMPRESSION METHOD BASED ON KD TREE AND OPTIMIZED GRAPH TRANSFORMATION

(71) Applicant: PEKING UNIVERSITY SHENZHEN GRADUATE SCHOOL, Shenzhen (CN)

(72) Inventors: Ge Li, Shenzhen (CN); Yiting Shao, Shenzhen (CN)

(73) Assignee: Peking University Shenzhen Graduate School, Shenzhen (CN)

( * ) Notice: Subject to any disclaimer, the term of this patent is extended or adjusted under 35 U.S.C. 154(b) by 0 days.

(21) Appl. No.: 16/476,975

(22) PCT Filed: Mar. 29, 2018

(86) PCT No.: PCT/CN2018/081082
§ 371 (c)(1),
(2) Date: Jul. 10, 2019

(87) PCT Pub. No.: WO2019/019680
PCT Pub. Date: Jan. 31, 2019

(65) Prior Publication Data
US 2019/0355152 A1    Nov. 21, 2019

(30) Foreign Application Priority Data

Jul. 28, 2017 (CN) .......................... 2017 1 0628315

(51) Int. Cl.
*G06T 9/40* (2006.01)
*G06T 3/40* (2006.01)
*H03M 7/30* (2006.01)

(52) U.S. Cl.
CPC .............. *G06T 9/40* (2013.01); *G06T 3/4084* (2013.01); *H03M 7/30* (2013.01)

(58) Field of Classification Search
None
See application file for complete search history.

(56) References Cited

U.S. PATENT DOCUMENTS

| | | | |
|---|---|---|---|
| 2017/0214943 A1* | 7/2017 | Cohen | H04N 19/136 |
| 2018/0188043 A1* | 7/2018 | Chen | G01C 11/30 |

FOREIGN PATENT DOCUMENTS

| | | |
|---|---|---|
| CN | 103886625 A | 6/2014 |
| CN | 106846425 A | 6/2017 |
| CN | 107403456 A | 11/2017 |

OTHER PUBLICATIONS

Chaudhury et al., Junction-Based Correspondence Estimation of Plant Point Cloud Data Using Subgraph Matching, IEEE Geoscience and Remote Sensing Letters, vol. 13, No. 8, Aug. 2016, pp. 1119-1123. (Year: 2016).*

(Continued)

*Primary Examiner* — Tahmina N Ansari
(74) *Attorney, Agent, or Firm* — Burr & Forman LLP

(57) ABSTRACT

Provided is a point cloud attribute compression method based on a KD tree and optimized graph transformation, wherein same, with regard to point cloud data, reduces the influence of a sub-graph issue on the graph transformation efficiency by means of a new transformation block division method, optimizes a graph transformation kernel parameter, and improves the compression performance of the graph transformation, and comprises: point cloud pre-processing, point cloud KD tree division, graph construction in the transformation block, graph transformation kernel parameter training, and a point cloud attribute compression process. The present invention optimizes the division method for a point cloud transformation block, and makes the number of points in the transformation block the same, and also realizes that the dimensionality of a transformation matrix is basically the same, so as to facilitate parallel (Continued)

processing of subsequent graph transformations; also optimizes the graph establishment in the transformation block, and avoids the sub-graph issue caused by the existing method; and at the same time optimizes, by training the kernel parameter of the graph transformation, the sparsity of a graph transformation Laplacian matrix, so as to achieve a better point cloud attribute compression performance.

8 Claims, 3 Drawing Sheets

(56) References Cited

OTHER PUBLICATIONS

Bhutta et al., "PCR-Pro: 3D Sparse and Different Scale Point Clouds Registration and Robust Estimation of Information Matrix for Pose Graph SLAM", Proc of 2018 IEEE 8th Annual International Conference on CYBER Technology in Automation, Control, and Intelligent Systems, Jul. 19-23, 2018, Tianjin China. (Year: 2018).*
International Search Report and Written Opinion of PCT/CN2018/081082 dated Jun. 4, 2018, all enclosed pages cited.
Office action from corresponding Chinese application No. 201710628315.4 dated Mar. 20, 2019, all enclosed pages cited.

* cited by examiner $$W = \begin{pmatrix} 0 & \omega_{12} & \omega_{13} & \omega_{14} & \omega_{15} \\ \omega_{12} & 0 & \omega_{23} & \omega_{24} & \omega_{25} \\ \omega_{13} & \omega_{23} & 0 & \omega_{34} & \omega_{35} \\ \omega_{14} & \omega_{24} & \omega_{34} & 0 & \omega_{45} \\ \omega_{15} & \omega_{25} & \omega_{35} & \omega_{45} & 0 \end{pmatrix}$$

(a)  (b)

POINT CLOUD ATTRIBUTE COMPRESSION METHOD BASED ON KD TREE AND OPTIMIZED GRAPH TRANSFORMATION

TECHNICAL FIELD

The present invention belongs to the technical field of point cloud data processing and relates to a point cloud data compression method, in particular to a point cloud attribute compression method based on a K-dimension tree (KD tree) and an optimized graph transformation.

BACKGROUND ART

With the rapid development of three-dimensional (3D) scanning devices, it is possible to quickly digitize 3D information in the real world. The point cloud is gradually becoming an effective way to express a 3D scene and a 3D surface of an object. As compared with the traditional two-dimensional (2D) pictures and videos, the point cloud is usually distributed discretely in the 3D space in a form of points, thereby supporting a free viewpoint and a multi-angle viewing, satisfying people's user experience of the 3D world, and being applied more and more widely. The point cloud is acquired by sampling the surface of the object by the 3D scanning device. There are a large number of points, and each point contains (x, y, z) geometric information, and attribute information such as color and texture, i.e., the information amount is large, so the point cloud has a huge data amount. In consideration of the large data amount of the point cloud and the limited bandwidth of the network transmission, the point cloud compression is an imperative task.

The point cloud compression is mainly classified into a geometric compression and an attribute compression, wherein the point cloud attribute compression is an active and promising technical research field. The existing framework of the point cloud attribute compression mainly includes:

I. A method based on octree decomposition and hierarchical transformation: the method firstly uses an octree to perform a spatial decomposition of the point cloud, and then uses low-level attribute information to predict high-level attribute information based on a hierarchical structure of the octree, thereby realizing a hierarchical transformation. This method has a high processing efficiency but a poor compression performance.

II. A method based on octree decomposition and Discrete Cosine Transform (DCT): the method firstly uses an octree to perform a spatial decomposition of the point cloud to obtain a hierarchical structure from a "root node" to a "leaf node"; then carries out a depth-first traversal on the octree, and writes the traversed node color values into a 2D JPEG table in a serpentine manner; next, uses an existing JPEG encoder to encode a obtained point cloud color table, wherein the JPEG encoder adopts a DCT transform. This method uses the existing encoder and has a low computational complexity, but it does not make full use of the spatial correlation between the points and needs to be improved in the compression performance.

III. A method based on octree decomposition and graph transformation: the method firstly uses an octree to perform a spatial decomposition of the point cloud, which is divided into a certain hierarchy to obtain a transformation block, and a graph is formed in each transformation block; within the transformation block, two points with a distance not more than 1 along any coordinate axis are connected by an edge whose weight is inversely proportional to an Euclidean distance, and the points and the edge form a graph; next, a graph transformation is carried out on the attribute information of the nodes on the graph. This method has a good compression performance, but the computational complexity is relatively high, and its composition mode may bring about a sub-graph issue, which affects the efficiency of the graph transformation, so there is still room for an improvement of the compression performance.

SUMMARY OF THE INVENTION

In order to overcome the above deficiencies of the prior arts, the present invention provides a point cloud attribute compression method based on a K-dimension tree (KD tree) and an optimized graph transformation, which proposes a new transformation block division way, thereby reducing the influence of a sub-graph issue on an efficiency of a graph transformation, optimizing a kernel parameter of the graph transformation, and further improving the compression performance of the graph transformation.

The technical solutions provided by the present invention are:

A point cloud attribute compression method based on a KD tree and an optimized graph transformation, which with regard to point cloud data, reduces an influence of a sub-graph issue on an efficiency of a graph transformation by means of a new transformation block division method, optimizes a kernel parameter of the graph transformation, and improves a compression performance of the graph transformation, comprising the steps of:

1) preprocessing of the point cloud: reading point cloud data to be processed, and computing a size of the bounding box according to a spatial distribution and a 3D coordinate position of the point cloud;

2) a KD tree division for a point cloud geometry: when a KD tree division is made for the point cloud, each time a coordinate axis with a largest distribution variance among position coordinates of the point cloud is selected as a division axis, on which a point with a median coordinate value is selected as a division point, and the division is iterated until a set KD tree depth is reached to obtain transformation blocks with evenly distributed points;

3) constructing a graph in the transformation block: every two points $n_i$ and $n_j$ in each transformation block are connected by an edge to obtain a graph G composed of points n and edges ε, wherein a weight $\omega_{ij}$ of an edge $\varepsilon_{ij}$ is determined by a set parameter σ and a kernel parameter τ, so as to further obtain a feature vector matrix as a transformation matrix of the graph;

4) performing optimization training on the kernel parameter τ of the transformation matrix to obtain a value of the kernel parameter of the transformation matrix that achieves an optimal compression performance:

selecting a part from all transformation blocks of the current point cloud as a training data set, and performing graph transformation processing on point cloud attribute information of the training data set to obtain a value of the kernel parameter τ of the transformation matrix that achieves an optimal compression performance;

5) performing an attribute compression of the point cloud: applying the value of the kernel parameter τ of the transformation matrix obtained by training into graph transformation processing on all transformation blocks of the point cloud, and obtaining a transformation matrix of each transformation block after the transformation, thereby realizing an attribute compression of the point cloud.

The division method of the transformation block of the point cloud can adaptively carry out a division transformation according to the distribution of the point cloud, so that the dimensions of the transformation matrix are substantially the same to facilitate the parallel processing of the later graph transformations.

3) a construction of a graph in a transformation block: after the spatial division of the point cloud in step 2), the transformation blocks with evenly distributed points are obtained, and every two points in each transformation block are connected by an edge to form a graph G composed of points n and edges ε, wherein a weight of the edge reflects a correlation between two points, has a value range of [0, 1), and is determined a set parameter σ and a kernel parameter τ to be trained.

The present invention optimizes the construction of the graph in the transformation block, avoids the sub-graph issue caused by the existing methods, and improves the efficiency of the graph transformation.

4) An optimization of the kernel parameter of the transformation matrix: in comprehensive consideration of the delay caused by the parameter training and the performance optimization, 50% of all transformation blocks of the current point cloud are randomly selected as the training data, the point cloud attribute information of the training set is subjected to graph transformation processing, and the value range of τ is traversed to obtain a value of τ that achieves an optimal compression performance; multiple times of experiments are carried out until the values of τ obtained by training with different training sets tend to a stable value;

(5) An attribute compression of the point cloud: applying the value of τ obtained by training to graph transformation processing of all the transformation blocks of the point cloud, thereby realizing an attribute compression of the point cloud.

The computation of the size of the bounding box in step 1) specifically comprises:

(1-1) traversing three-dimensional coordinates of all points in the point cloud to obtain a minimum coordinate $x_{min}$ and a maximum coordinates $x_{max}$ of an x-axis, a minimum coordinate $y_{min}$ and a maximum coordinate $y_{max}$ of a y-axis, and a minimum coordinate $z_{min}$ and a maximum coordinate $z_{max}$ of a z-axis;

(1-2) representing the size of the bounding box of the point cloud as B which is represented as:

$$B = (x_{max} - x_{min}) \times (y_{max} - y_{min}) \times (z_{max} - z_{min}) \quad \text{(Equation 1)}$$

In step 2), the KD tree division method is a binary division method, wherein a coordinate axis with a largest distribution variance of points is selected as a division axis, so that the spatial distribution characteristics of the points are fully considered, and the correlations between the points in the transformation block are ensured; meanwhile, a point with a median coordinate value on the division axis is selected as a division point, so that the number of the points in each transformation block is substantially the same; it is assumed that the point cloud to be processed has N points, and a set division depth of a KD tree is d, then the number of points in each transformation block is substantially the same, which is $$\left\lfloor \frac{N}{2^d} \right\rfloor \text{ or } \left\lceil \frac{N}{2^d} \right\rceil,$$

after d times of divisions of the bounding box.

The construction of the graph and the graph transformation in step 3) specifically comprise:

(3-1) constructing a graph in each transformation block, wherein all points n therein are those on the graph G, every two points $n_i$ and $n_j$ are connected by an edge $\varepsilon_{ij}$, and a weight $\omega_{ij}$ of the edge $\varepsilon_{ij}$ is determined by a set parameter σ and a kernel parameter τ, and represented by Equation 2:

$$\omega_{i,j} = \begin{cases} e^{-\frac{\|n_i - n_j\|_2^2}{\sigma^2}}, & \text{if } \|n_i - n_j\|_2^2 \leq \tau; \\ 0, & \text{else,} \end{cases} \quad \text{(Equation 2)}$$

wherein $n_i$ and $n_j$ are two points connected by one edge, the parameter σ is a global variable that reflects a variance of the point cloud distribution, and its magnitude does not affect a generation of a feature vector of a Laplacian matrix of the graph, so an empirical set value is generally adopted; and the parameter τ is a distance threshold to judge a correlation between two points, which determines a sparsity of the Laplacian matrix of the graph, affects a generation of a transformation matrix and plays an important role in the performance of the attribute compression.

(3-2) an adjacent matrix W of the graph G is a set of edge weights $\omega_{ij}$ to reflect correlations between points in a transformation block; a density matrix D of the graph G is a diagonal matrix, and is represented as D=diag($D_1$, . . . $D_i$ . . . ,$D_n$), where $D_i$ is the number of non-zero elements in an i-th row of the adjacent matrix, and reflects an density of correlations between an i-th point and other points; and a transformation operator of the graph G is a Laplacian matrix L represented by:

$$L = D - W \quad \text{(equation 3)}$$

(3-3) the Laplacian matrix L is subjected to a feature decomposition through Equation 4 to obtain a feature vector matrix A as a transformation matrix of the graph, which is used for an attribute information compression of the point cloud:

$$L = A \Lambda A^{-1} \quad \text{(Equation 4)}$$

In step 4), the optimization of the kernel parameter of the transformation matrix specifically comprises:

(4-1) randomly selecting 50% of all transformation blocks of the current point cloud as training data; here not all the transformation blocks are selected for training, so as to reduce the training processing delay on the basis of ensuring the optimization performance; a part of the point cloud data is used to train the kernel parameter, and the characteristics of the overall distribution of the point cloud are summarized from the local laws.

(4-2) a key to the compression performance of the point cloud is the value of the kernel parameter τ. From equation 2 in step 4), it can be seen that under the premise that the change range of the distance between two points in the transformation block is unknown, the value range of τ is difficult to be determined, which hinders the processing of obtaining an optimal solution by traversing τ. Therefore, the kernel parameter τ is represented by τ' determined a determined value range of (0, 1), wherein τ' is represented as follows:

$$\tau' = e^{-\frac{\tau}{\sigma^2}} \quad \text{(Equation 5)}$$

(4-3) performing a graph transformation of a training set, traversing the value range of τ' with an accuracy of 0.05 to obtain an optimal code stream compression performance, and recording τ' at this time; randomly selecting the training set again, and performing experiments for multiple times until the value of τ' corresponding to a maximum code stream compression ratio tends to a stable value.

In step 5), the attribution compression of the point cloud specifically comprises: (5-1) after the training process of the value of τ in step 4), corresponding transformation matrix is obtained for each transformation block according to a point distribution, a set value of σ and a trained value of τ; it is assumed that a color signal matrix of a transformation block is $Y_o$ and the transformation matrix of the graph is A, then a matrix obtained by a graph transformation of the color signal of the transformation block is $Y_t$, which is represented by:

$$Y_t = Y_o * A \quad \text{(Equation 6)}$$

(5-2) binarizing and entropy encoding the matrix $Y_t$ after the graph transformation to obtain a final code stream of an attribute signal of the point cloud; the compression performance of the graph transformation is measured by a ratio between code rates of the attribute signal of the point cloud before and after the graph transformation, which is represented by:

$$\eta = \frac{\text{bitrate}(Y_o)}{\text{bitrate}(Y_t)} \quad \text{(Equation 7)}$$

wherein bitrate is a code rate of the signal having been binarized and entropy encoded; and η is a ratio between the code rates of the attribute signal of the point cloud before and after the graph transformation.

The above method uses the optimized graph transformation to compress the point cloud attribute, trains the kernel parameter of the transformation matrix, optimizes the sparsity of the Laplacian matrix, and realizes a better compression performance of the point cloud.

As compared with the prior art, the present invention has the following beneficial effects:

The present invention provides a point cloud attribute compression method based on a KD tree and an optimized graph transformation, and has the following technical advantages:

(I) it proposes a new division method of the transformation block of the point cloud, adaptively carries out a division transformation according to the distribution of the point cloud, so that the dimensions of the transformation matrix are substantially the same to facilitate the parallel processing of the later graph transformations;

(II) it optimizes the construction of the graph in the transformation block, avoids the sub-graph issue caused by the existing methods, and improves the efficiency of the graph transformation;

(III) it uses the optimized graph transformation to compress the point cloud attribute, trains the kernel parameter of the transformation matrix, optimizes the sparsity of the Laplacian matrix, and realizes a better compression performance of the point cloud.

DETAILED DESCRIPTION OF THE INVENTION

The present invention will be further described through the embodiments with reference to the drawings, but the scope of the present invention is not limited in any way.

Figure 1:
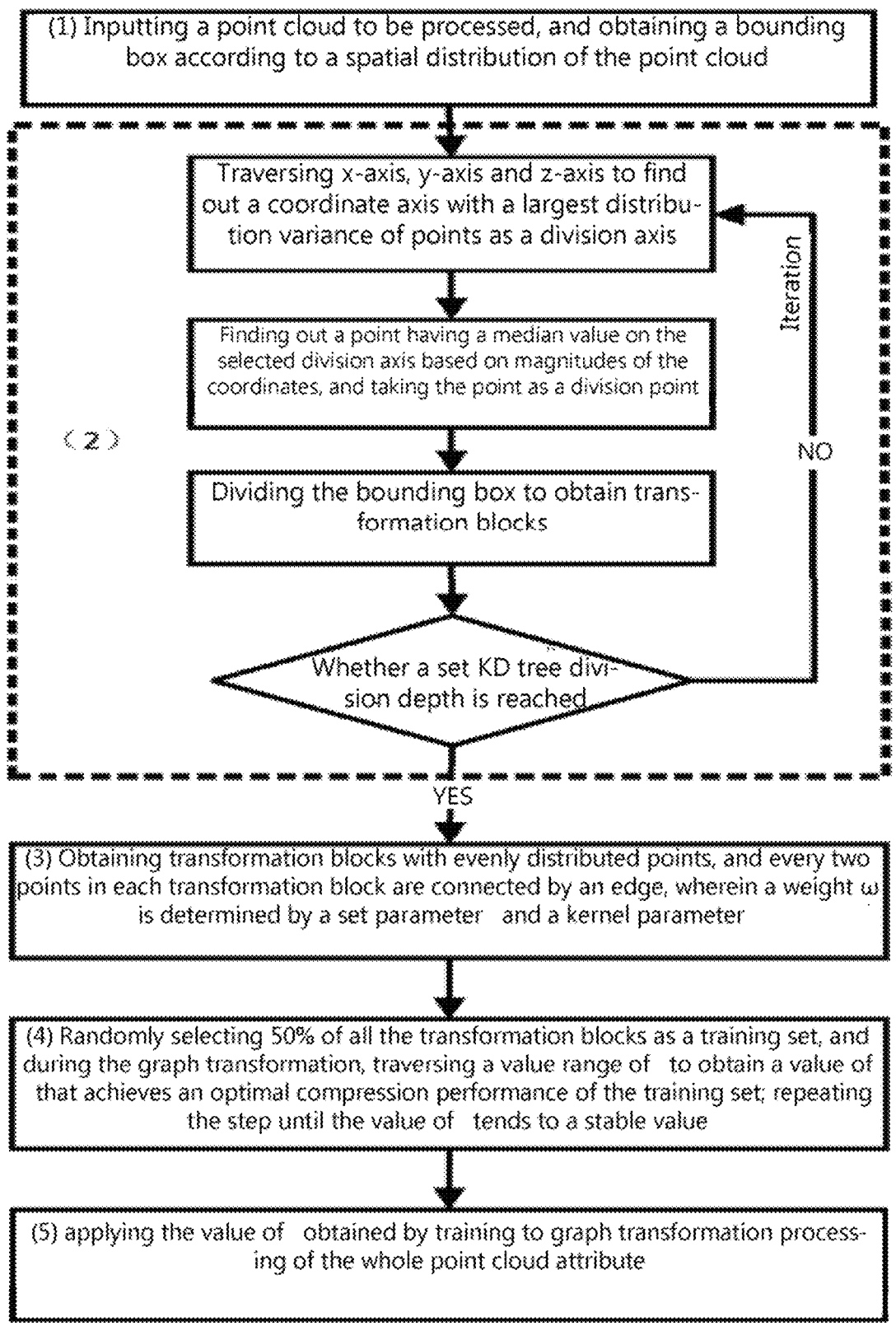
FIG. 1 shows a flow block diagram of a method provided by the present invention.

The present invention provides a point cloud attribute compression method based on a KD tree and an optimized graph transformation, and with regard to point cloud data, reduces the influence of a sub-graph issue on the efficiency of the graph transformation by means of a new transformation block division method, optimizes the kernel parameter of the graph transformation, and further improves the compression performance of the graph transformation. FIG. 1 shows a flow block diagram of a method provided by the present invention.

Next, for a high-quality point cloud soldier_vox10_0537.ply disclosed by 8i company in MPEG, a point cloud attribute compression is carried out by adopting the method of the present invention, as shown in FIG. 1, specifically comprising the steps of:

(1) preprocessing of the point cloud: reading point cloud data to be processed, traversing 3D coordinates of all points in the point cloud, and according to a spatial distribution and 3D coordinate positions of the point cloud, obtaining a minimum coordinate $x_{min}$ and a maximum coordinates $x_{max}$ of an x-axis, a minimum coordinate $y_{min}$ and a maximum coordinate $y_{max}$ of a y-axis, and a minimum coordinate $z_{min}$ and a maximum coordinate $z_{max}$ of a z-axis, wherein a size of a bounding box B is $(x_{max}-x_{min}) \times (y_{max}-y_{min}) \times (z_{max}-z_{min})$, and represented by Equation 1:

$$B = (x_{max}-x_{min}) \times (y_{max}-y_{min}) \times (z_{max}-z_{min}) \quad \text{(Equation 1)}$$

after traversing the point cloud soldier_vox10_0537.ply, $x_{min}$ is 29 and $x_{max}$ is 389; $y_{min}$ is 7 and $y_{max}$ is 1023; $z_{min}$ is 31 and $z_{max}$ is 436; and the size of the bounding box B is 148132800.

Figure 2:
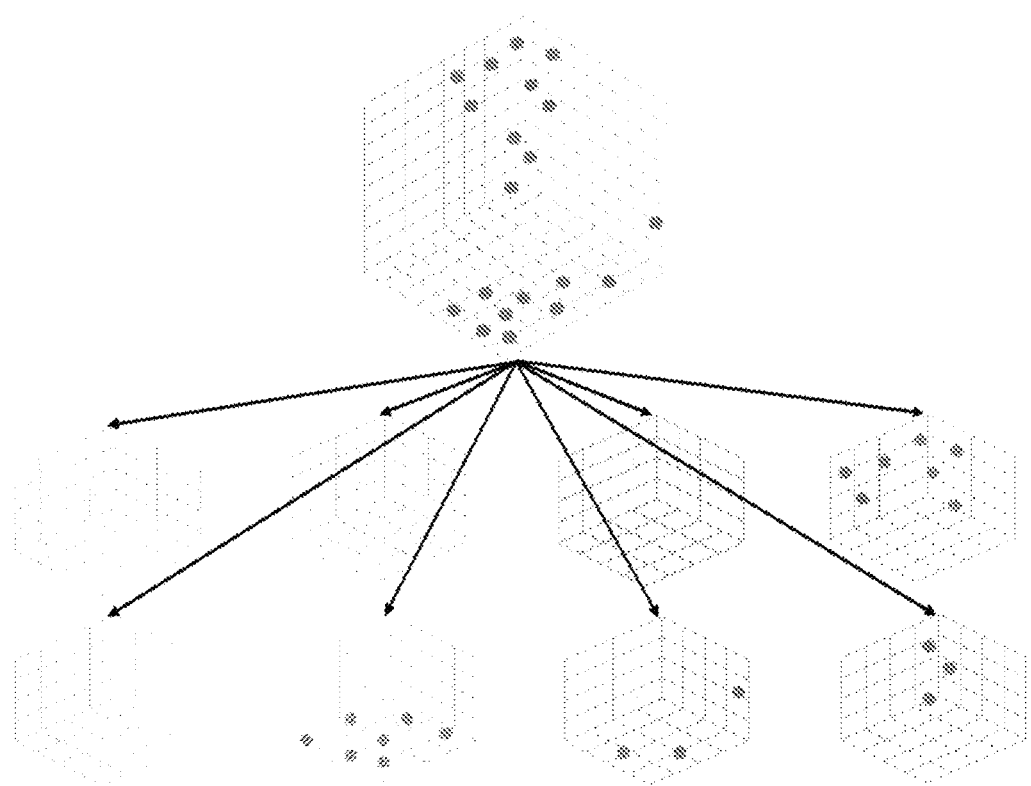
FIG. 2 shows an example diagram of an octree division of an existing point cloud space.
Figure 3:
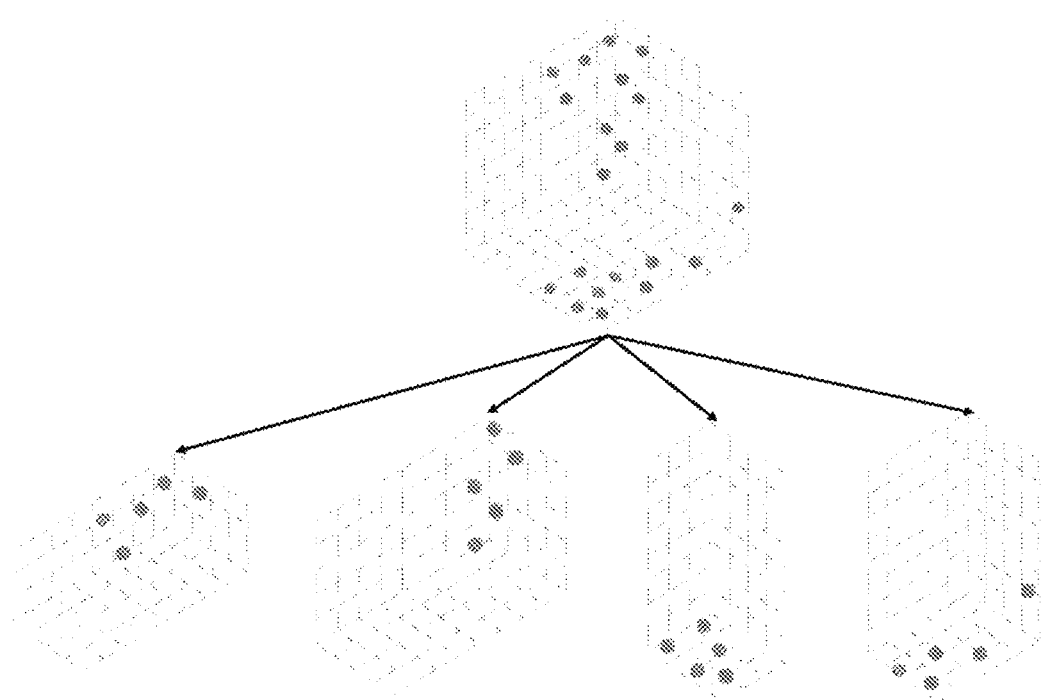
FIG. 3 shows an example diagram of a KD tree division of a point cloud adopted by a method of the present invention.

(2) a KD tree division for a point cloud geometry: when a KD tree division is made for the point cloud, each time a coordinate axis with a largest distribution variance among position coordinates of the point cloud is selected as a division axis, on which a point with a median coordinate value is selected as a division point, and the division is iterated until a set KD tree depth is reached. In consideration of the influence of the processing time and the transformation block size on the compression performance, the KD tree division generally keeps the number of the points in the transformation block within a range of (100, 200). It is assumed that the point cloud to be processed has N points, and a set division depth of the KD tree is d, then the number of points in each transformation block is substantially the same, which is $$\left\lfloor \frac{N}{2^d} \right\rfloor \text{ or } \left\lceil \frac{N}{2^d} \right\rceil,$$

after d times of divisions of the bounding box. FIGS. 2 and 3 show a KD tree division method proposed by the present invention and a traditional octree division method, respectively. It can be seen that the difference between the above two methods is that the KD tree division can make the number of the points in the block be substantially the same and there be no empty block, while the octree division results in an uneven point distribution and a large number of empty blocks.

The point cloud soldier_vox10_0537. ply totally has 1062090 points, a KD tree division depth d is set to 13, and the number of the points in the block is 129 or 130 after the division.

Figure 4:
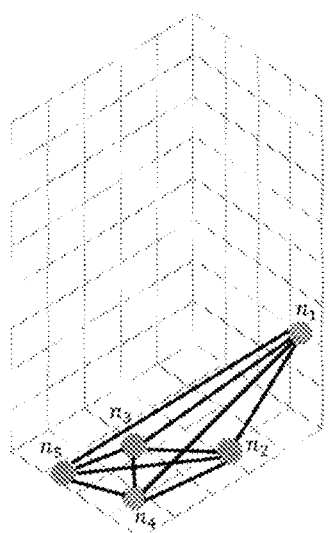
FIG. 4 shows example diagrams of a construction of a graph in a transformation block and an adjacent matrix after a KD tree division, wherein (a) shows a construction of a graph G in a transformation block, and n1 to n5 are points in the transformation block; and (b) shows an adjacent matrix W of the graph G.

(3) a construction of a graph in a transformation block: after a spatial division of the point cloud in step (2), transformation blocks with substantially evenly distributed points are obtained, and every two points in each transformation block are connected by an edge to form a graph G composed of points n and edges ε, as shown in FIG. 4 (a), wherein a weight of the edge reflects a correlation between two points, and has a value range of [0, 1). The details of the parameters in the graph are as follows:

(3-1) a determination of an edge weight: the weight is determined by a set parameter σ and a kernel parameter τ to be trained. The parameter σ is a global variable that reflects a variance of the point cloud distribution, and its magnitude does not affect a generation of a feature vector of a Laplacian matrix of the graph, so an empirical set value is generally adopted; and the parameter τ is a distance threshold to judge a correlation between two points, which affects a generation of a transformation matrix and plays an important role in the performance of the attribute compression. The optimal parameter is obtained by obtaining, but since its value range is uncertain, τ is represented by $$\tau' = e^{-\frac{\tau}{\sigma^2}}$$ (Equation 5)

which has a value range of (0,1).

(3-2) An adjacent matrix of the graph: as shown in FIG. 4 (b), the adjacent matrix W of the graph G is a set of edge weights $\omega_{ij}$ to reflect correlations between points in a transformation block, wherein a weight $\omega_{ij}$ of an edge $\varepsilon_{ij}$ is determined by the set parameter 6 and the kernel parameter τ, and represented by Equation 2:

$$\omega_{i,j} = \begin{cases} e^{-\frac{\|n_i - n_j\|_2^2}{\sigma^2}}, & \text{if } \|n_i - n_j\|_2^2 \le \tau; \\ 0, & \text{else}, \end{cases}$$ (Equation 2)

wherein the parameter σ is a global variable that reflects a variance of the point cloud distribution, and its magnitude does not affect a generation of a feature vector of a Laplacian matrix of the graph, so an empirical set value is generally adopted; and the parameter τ is a distance threshold to judge a correlation between two points, which determines a sparsity of the Laplacian matrix of the graph, affects a generation of a transformation matrix and plays an important role in the performance of the attribute compression.

(3-3) a density matrix of the graph: a density matrix D of the graph G is a diagonal matrix, and is represented as D=diag($D_1$, ... $D_i$ ... ,$D_n$), where $D_i$ is the number of non-zero elements in an i-th row of the adjacent matrix, and reflects an density of correlations between an i-th point and other points.

(3-4) a Laplacian matrix of the graph: a transformation operator of the graph G is generally a Laplacian matrix L represented by Equation 3:

$$L=D-W$$ (equation 3)

(3-5) a transformation matrix of the graph: the Laplacian matrix L is subjected to a feature decomposition to obtain a feature vector matrix A as a transformation matrix of the graph, which is used for the attribute information compression of the point cloud, wherein the feature decomposition is represented by Equation 4:

$$L=A\Lambda A^{-1}$$ (Equation 4)

(4) an optimization of the kernel parameter of the transformation matrix: as can be seen from step (3), a key to the compression performance of the point cloud is the value of the kernel parameter τ, so an optimal parameter value is adaptively obtained by training. In consideration of the delay caused by the parameter training and the performance optimization, 50% of all transformation blocks of the current point cloud are randomly selected as the training data, and the point cloud attribute information of the training set is subjected to graph transformation processing, and the value range (0,1) of τ' is traversed with an accuracy of 0.05 to obtain an optimal code stream compression performance, and τ' at this time is recorded; the training set is randomly selected again, and the code stream compression performance and τ' at this time are recorded again; multiple times of experiments are carried out until τ' corresponding to a maximum code stream compression ratio tends to a stable value, thereby obtaining a final τ training value.

When graph transformation processing is made on the point cloud soldier_vox10_0537. ply, $$\frac{1}{\sigma^2}$$

is set to 0.2, and the value range (0,1) of τ' is traversed with an accuracy of 0.05 to obtain the corresponding compression performance. When the value of τ' is 0.75, the attribute compression achieves the best performance, so the final training value of τ' is 0.75.

(5) an attribute compression of the point cloud: the value of τ obtained by training is applied to the graph transformation processing of all transformation blocks of the point cloud, so as to realize the attribute compression of the point cloud. The details are as follows:

(5-1) corresponding transformation matrix is obtained for each transformation block of the point cloud according to the point distribution and the parameter values of σ and τ; it is assumed that a color signal matrix of a transformation block is $Y_o$ and the transformation matrix of the graph is A, then a matrix obtained by a graph transformation of the color signal of the transformation block is $Y_t$, which is represented by:

$$Y_t=Y_o*A$$ (Equation 6)

(5-2) next, binarizing and entropy encoding the matrix $Y_t$ after the graph transformation to obtain a final code stream of an attribute signal of the point cloud; the compression performance of the graph transformation is measured by a ratio between code rates of the attribute signal of the point cloud before and after the graph transformation, which is represented by:

$$\eta = \frac{\text{bitrate } (Y_o)}{\text{bitrate } (Y_t)} \qquad \text{(Equation 7)}$$

In order to verify the effect of the point cloud attribute compression method based on a KD tree and an optimized graph transformation of the present invention, the high-quality 8i point cloud sequence in the data set provided by the MPEG PCC Ad-hoc Group is adopted, wherein 4 frames of point clouds therein are used for experiments, and the results are shown in Table 1

TABLE 1

Comparisons between compression performances of the method of the present invention and the existing traditional methods

| Testing Datasets | Proposed Method | | PCC(DCT-based) | |
|---|---|---|---|---|
| | Y-PSNR (dB) | Bitrate (bpp) | Y-PSNR (dB) | Bitrate (bpp) |
| 1. longdress_vox10_1051 | 33.65 | 0.89 | 32.56 | 2.76 |
| 2. loot_vox10_1000 | 35.18 | 0.29 | 37.81 | 1.41 |
| 3. redandblack_vox10_1451 | 34.38 | 0.55 | 36.1 | 1.54 |
| 4. soldier_vox10_0537 | 36.02 | 0.46 | 35.71 | 1.99 |

As can be seen from Table 1, the method of the present invention reduces the code rate by about 70% in terms of the point cloud attribute compression as compared with the existing traditional DCT methods. Although the computation amount is slightly larger, the compression performance is obviously advantageous, and the sub-graph issue in the past graph transformation is overcome, thereby achieving outstanding advantages.

It should be noted that the disclosed embodiments are intended to help further understanding of the present invention, but those skilled in the art will appreciate that various substitutions and modifications are possible without departing from the spirit and scope of the present invention and the appended claims. Therefore, the present invention should not be limited to those disclosed in the embodiments, and the scope of protection claimed by the present invention should be subject to the scope defined by the claims.

The invention claimed is:

1. A point cloud attribute compression method based on a KD tree and an optimized graph transformation, which with regard to point cloud data, reduces an influence of a sub-graph issue on an efficiency of a graph transformation by means of a new transformation block division method, optimizes a kernel parameter of the graph transformation, and improves a compression performance of the graph transformation, comprising the steps of:
   1) preprocessing a point cloud to obtain a size of a bounding box of the point cloud: reading point cloud data to be processed, and computing the size of the bounding box according to a spatial distribution and position coordinates of the point cloud;
   2) dividing a spatial geometry of the point cloud using a KD tree division method to obtain transformation blocks with evenly distributed points;
   when a KD tree division is made for the point cloud, each time a coordinate axis with a largest distribution variance among the position coordinates of the point cloud is selected as a division axis, on which a point with a median coordinate value is selected as a division point, and the division is iterated until a set KD tree depth is reached;
   3) constructing a graph in the transformation block: every two points $n_i$ and $n_j$ in each transformation block are connected by an edge to obtain a graph G composed of points n and edges $\varepsilon$, wherein a weight $\omega_{ij}$ of an edge $\varepsilon_{ij}$ is determined by a set parameter $\sigma$ and a kernel parameter $\tau$, so as to further obtain a feature vector matrix as a transformation matrix of the graph;
   4) performing optimization training on the kernel parameter $\tau$ of the transformation matrix to obtain a value of the kernel parameter of the transformation matrix that achieves an optimal compression performance:
   selecting a part from all transformation blocks of the current point cloud as a training data set, and performing graph transformation processing on point cloud attribute information of the training data set to obtain a value of the kernel parameter $\tau$ of the transformation matrix that achieves an optimal compression performance;
   5) performing an attribute compression of the point cloud: applying the value of the kernel parameter $\tau$ of the transformation matrix obtained by training into graph transformation processing on all transformation blocks of the point cloud, and obtaining a transformation matrix of each transformation block after the transformation, thereby realizing an attribute compression of the point cloud.

2. The point cloud attribute compression method according to claim 1, wherein in step 1), computing the size of the bounding box specifically comprises: traversing three-dimensional coordinates of all points in the point cloud to obtain a minimum coordinate $x_{min}$ and a maximum coordinates $x_{max}$ of an x-axis, a minimum coordinate $y_{min}$ and a maximum coordinate $y_{max}$ of a y-axis, and a minimum coordinate $z_{min}$ and a maximum coordinate $z_{max}$ of a z-axis; the size of the bounding box of the point cloud is computed through Equation 1:

$$B = (x_{max} - x_{min}) \times (y_{max} - y_{min}) \times (z_{max} - z_{min}) \qquad \text{(Equation 1)}$$

wherein B is the size of the bounding box of the point cloud.

3. The point cloud attribute compression method according to claim 1, wherein in step 2) the KD tree division method is a binary division method; specifically, a coordinate axis with a largest distribution variance of points is selected as a division axis, on which a point with a median coordinate value is selected as a division point, so that the number of points in each transformation block is substantially the same; it is assumed that the point cloud to be processed has N points, and a set division depth of a KD tree is d, then the number of points in each transformation block is substantially the same, which is $$\left\lfloor \frac{N}{2^d} \right\rfloor \text{ or } \left\lceil \frac{N}{2^d} \right\rceil,$$

after d times of divisions of the bounding box.

4. The point cloud attribute compression method according to claim 1, wherein step 3) specifically comprises:
   (3-1) constructing a graph in each transformation block, wherein all points n therein are those on the graph G, every two points $n_i$ and $n_j$ are connected by an edge $\varepsilon_{ij}$, and a weight $\omega_{ij}$ of the edge $\varepsilon_{ij}$ is determined by a set parameter $\sigma$ and a kernel parameter $\tau$, and represented by Equation 2:

$$\omega_{i,j} = \begin{cases} e^{\frac{\|n_i - n_j\|_2^2}{\sigma^2}}, & \text{if } \|n_i - n_j\|_2^2 \leq \tau; \\ 0, & \text{else,} \end{cases} \quad \text{(Equation 2)}$$

wherein the parameter σ is a global variable that reflects a variance of the point cloud distribution, and its magnitude does not affect a generation of a feature vector of a Laplacian matrix of the graph, so an empirical set value is generally adopted; and the parameter τ is a distance threshold to judge a correlation between two points, which determines a sparsity of the Laplacian matrix of the graph and is a kernel parameter of the transformation matrix;

(3-2) an adjacent matrix W of the graph G is a set of edge weights $\omega_{ij}$ to reflect correlations between points in a transformation block; a density matrix D of the graph G is a diagonal matrix, and is represented as D=diag $(D_1, \ldots D_i \ldots, D_n)$, where $D_i$ is the number of non-zero elements in an i-th row of the adjacent matrix, and reflects an density of correlations between an i-th point and other points; a transformation operator of the graph G is a Laplacian matrix L represented by Equation 3:

$$L = D - W \quad \text{(equation 3)}$$

(3-3) the Laplacian matrix L is subjected to a feature decomposition through Equation 4 to obtain a feature vector matrix A as a transformation matrix of the graph, which is used for an attribute information compression of the point cloud:

$$L = A\Lambda A^{-1} \quad \text{(Equation 4)}$$

wherein A is a feature vector matrix.

5. The point cloud attribute compression method according to claim 1, wherein the weight $\omega_{ij}$ of the edge $\varepsilon_{ii}$ has a value range of [0, 1).

6. The point cloud attribute compression method according to claim 1, wherein in step 4), the kernel parameter τ of the transformation matrix is optimized, and a value of τ that achieves an optimal compression performance is obtained by traversing the value range of τ; this step is repeated for multiple times until the value of τ obtained by training tends to a stable value, comprising:
  (4-1) randomly selecting 50% of all transformation blocks of the current point cloud as training data;
  (4-2) representing the kernel parameter τ using τ' with a determined value range of (0, 1), wherein τ' is represented by Equation 5:

$$\tau' = e^{-\frac{\tau}{\sigma^2}} \quad \text{(Equation 5)}$$

wherein the parameter σ is a global variable that reflects a variance of the point cloud distribution, and its magnitude does not affect a generation of a feature vector of a Laplacian matrix of the graph, so an empirical set value is generally adopted.

(4-3) performing a graph transformation of a training set, traversing the value range of τ' with a set accuracy to obtain an optimal code stream compression performance, and recording τ' at this time; randomly selecting the training set again, and training for multiple times until the value of τ' corresponding to a maximum code stream compression ratio tends to a stable value, and taking the value of τ' as the value of τ.

7. The point cloud attribute compression method according to claim 1, wherein in step (4-3), the set accuracy is 0.05.

8. The point cloud attribute compression method according to claim 1, wherein in step 5), performing an attribute compression of the point cloud comprises:
  (5-1) applying the value of the kernel parameter τ of the transformation matrix obtained by training in step 4) into the graph transformation of the point cloud, and obtaining corresponding transformation matrix of each transformation block, according to a point distribution and the values of the set parameter σ and the kernel parameter τ, wherein the transformation matrix is represented by Equation 6:

$$Y_t = Y_o * A \quad \text{(Equation 6)}$$

wherein $Y_o$ is a color signal matrix of the transformation block, A is a transformation matrix of the graph, and a matrix obtained by a graph transformation of the color signal of the transformation block is $Y_t$;

(5-2) binarizing and entropy encoding the matrix $Y_t$ after the graph transformation to obtain a final code stream of an attribute signal of the point cloud; the compression performance of the graph transformation is measured by a ratio between code rates of the attribute signal of the point cloud before and after the graph transformation, which is represented by:

$$\eta = \frac{\text{bitrate}(Y_o)}{\text{bitrate}(Y_t)} \quad \text{(Equation 7)}$$

wherein bitrate is a code rate of the signal having been binarized and entropy encoded; and η is a ratio between the code rates of the attribute signal of the point cloud before and after the graph transformation.

* * * * *